(12) United States Patent
DiStefano et al.

(10) Patent No.: US 6,370,032 B1
(45) Date of Patent: Apr. 9, 2002

(54) COMPLIANT MICROELECTRONIC MOUNTING DEVICE

(75) Inventors: Thomas H. DiStefano, Monte Sereno; John W. Smith, Palo Alto; Zlata Kovac, Los Gatos; Konstantine Karavakis, Pleasanton, all of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/399,209

(22) Filed: Sep. 17, 1999

Related U.S. Application Data

(60) Continuation of application No. 08/936,887, filed on Sep. 25, 1997, which is a division of application No. 08/812,202, filed on Mar. 6, 1997, now Pat. No. 5,706,174, which is a continuation of application No. 08/309,433, filed on Sep. 20, 1994, now abandoned, which is a continuation-in-part of application No. 08/440,665, filed on May 15, 1995, now Pat. No. 5,801,441, which is a division of application No. 08/271,768, filed on Jul. 7, 1994, now Pat. No. 5,518,964.

(51) Int. Cl.[7] .................................................. H05K 1/18
(52) U.S. Cl. ........................ 361/760; 361/783; 361/749; 174/254; 257/735; 257/786; 228/180.22
(58) Field of Search ................................. 361/760, 783, 361/749; 174/254, 262, 260, 261, 52.1, 52.4; 257/735, 786, 688, 689, 692; 439/66, 91, 67; 29/840, 846; 228/180.22

(56) References Cited

U.S. PATENT DOCUMENTS

| | | | |
|---|---|---|---|
| 4,234,666 A | 11/1980 | Gursky | |
| 4,642,889 A | 2/1987 | Grabbe | |
| 4,980,753 A | * 12/1990 | Dunaway et al. | ............ 257/737 |
| 5,107,325 A | * 4/1992 | Nakayoshi | .................. 257/793 |
| 5,127,570 A | 7/1992 | Steitz et al. | |
| 5,148,265 A | 9/1992 | Khandros et al. | |
| 5,148,266 A | * 9/1992 | Khandros et al. | ............ 257/773 |
| 5,194,930 A | 3/1993 | Papathomas et al. | |
| 5,203,076 A | 4/1993 | Banerji et al. | |
| 5,209,390 A | * 5/1993 | Temple et al. | ......... 228/180.22 |
| 5,249,101 A | 9/1993 | Frey et al. | |
| 5,316,788 A | 5/1994 | Dibble et al. | |
| 5,355,283 A | 10/1994 | Marrs et al. | |
| 5,398,863 A | 3/1995 | Grube et al. | |
| 5,477,611 A | 12/1995 | Sweis et al. | |
| 5,518,964 A | 5/1996 | DiStefano et al. | |
| 5,563,445 A | 10/1996 | Iijima et al. | |
| 5,937,277 A | * 8/1999 | Matsuda et al. | ............. 438/119 |
| 5,971,253 A | * 10/1999 | Gilleo et al. | ........... 228/180.22 |
| 6,061,246 A | * 5/2000 | Oh et al. | ..................... 361/749 |

FOREIGN PATENT DOCUMENTS

| | | |
|---|---|---|
| WO | 94-03036 | 2/1994 |

\* cited by examiner

*Primary Examiner*—Leo P. Picard
*Assistant Examiner*—David Foster
(74) *Attorney, Agent, or Firm*—Lerner, David, Littenberg, Krummholz & Mentlik, LLP

(57) ABSTRACT

The present invention provides an interconnection scheme having complaint contacts arranged in an array to connect conductive surfaces on a microelectronic device and a supporting substrate, such as a printed circuit board. This invention accommodates for the difference in thermal coefficients of expansion between the device and the supporting substrate. Typically, an area array of conductive contact pads are connected into rows by conductive leads on a flexible, intermediate substrate. Each of the conductive leads bridges a bonding hole in the intermediate substrate which is situated between successive contact pads. Each of the conductive leads further has a frangible portion within or near each bonding hole. A stand-off between the intermediate substrate and the device is create by compliant dielectric pads, typically composed of an elastomer material, positioned under each contact pad. The frangible portions allow the leads to be cleanly broken, bent and secured into electrical contact with chip contacts on the device. Each of these connections may be supported by a compliant layer, typically an uncured elastomer which fills the area around the compliant dielectric pads and is then cured.

20 Claims, 3 Drawing Sheets

COMPLIANT MICROELECTRONIC MOUNTING DEVICE

This is a continuation of U.S. application Ser. No. 08/936,887, filed Sep. 25, 1997, which is in turn a division of U.S. application Ser. No. 08/812,202,filed Mar. 6, 1997, now U.S. Pat. No. 5,706,174,which in turn is a continuation of U.S. application Ser. No. 08/309,433, filed Sep. 20, 1994, now abandoned, which is in turn a continuation-in-part of U.S. application Ser. No. 08/440,665 filed May 15, 1995, now U.S. Pat. No. 5,801,441, which in turn is a division of U.S. application Ser. No. 08/271,768, filed Jul. 7, 1994, now U.S. Pat. No. 5,518,964, the disclosures of all of the above identified patent applications and/or patents being hereby incorporated by reference herein.

FIELD OF THE INVENTION

The present invention relates, generally, to interconnecting microelectronic devices and supporting substrates, and more particularly relates to a method and apparatus for compliantly interconnecting microelectronic devices and supporting substrates while substantially obviating the problems encountered due to their differences in the thermal coefficients of expansion.

BACKGROUND OF THE INVENTION

Semiconductor chips typically are connected to external circuitry through contacts on a surface of the chip. To save area on a supporting substrate, such as a printed circuit board, these chips are typically directly connected/soldered to the substrates and from there connected to external circuitry on other parts of the substrate. The contacts on the chip are generally either disposed in regular grid-like patterns, substantially covering the front surface of the chip (commonly referred to as an "area array") or in elongated rows extending parallel to and adjacent each edge of the chip front surface. The various prior art processes for making the interconnections between the semiconductor chip contacts and the supporting substrate use prefabricated arrays of leads/discrete wires, solder bumps or combinations of both. One or more integrated circuit ("IC") chips are typically mounted in a package or microelectronic device, such as a ceramic multichip module, that is suited for attachment by soldering to a wiring substrate, such as a printed wiring board or module. The body of the microelectronic device may be comprised of a molded plastic or ceramic material. Many of the techniques for solder attachment run into problems because of the thermal expansion mismatch between the material the microelectronic device is composed of and the material the supporting substrate is made of, such as a printed circuit board. In other words, when heat is applied to the microelectronic device/substrate combination, they both expand; and when the heat is removed, the device and the substrate both contract. The problem that arises is that the device and the substrate expand and contract at different rates and at different times, thereby stressing the interconnections between them.

In attempting to use the area on printed circuit boards more efficiently, IC manufacturers have recently been switching from larger, more cumbersome interconnection conventions, such as pin grid arrays ("PGAs") and the perimeter leaded quad flat packs ("QFPs"), to smaller conventions, such as ball grid arrays ("BGAs"). Using BGA technology, microelectronic devices are typically interconnected with their supporting substrates using solder connections, such as with "flip-chip" technology. However, when solder alone is used to interconnect the microelectronic device's contacts to the substrate, the columns of solder are generally designed to be short to maintain the solder's structural integrity. This results in minimal elastic solder connection properties which further results in increased susceptibility to solder cracking due to fatigue brought on by the thermal cycling (heating and cooling cycles of the device/substrate).

An interconnection solution put forth in U.S. Pat. No. 4,642,889, entitled "Compliant Interconnection and Method Therefor" issued Apr. 29, 1985 to Grabbe seeks to alleviate the aforementioned solder cracking problem by embedding wires within each solder column to reinforce the solder thereby allowing higher solder pedestals and more elasticity. Another solution includes spirally wrapping wire around the outside of the solder. A further solution put forth includes providing a combination of solder and high lead solder, as found in U.S. Pat. No. 5,316,788, entitled "Applying Solder to High Density Substrates" issued to Dibble et al. All of these prior art solutions are aimed at increasing the compliancy of the interconnections in order to reduce the shear stress endured by the interconnections because of the thermal cycling. However, as microelectronic devices are reduced in size, the number of devices packed into a given area will be greater. The heat dissipated by the each of these devices will have a greater effect on the surrounding devices and will thus increase the need for a highly compliant interconnection scheme for each device. Further, as the number of device interconnections increases, as is the case when chips are integrated into multichip modules, the overall rigidity of the total interconnection also increases thereby again increasing the need for a highly compliant interconnection scheme. None of the aforementioned prior solutions provides an interconnection scheme which is compliant enough to effectively deal with these problems.

Several inventions, commonly assigned to the assignee of the present invention, deal effectively, but specifically differently, with the thermal cycling problem. For example, U.S. Pat. No. 5,148,266 discloses improvements in semiconductor chip assemblies and methods of making the same. As set forth in the '266 patent, a semiconductor chip can be connected to a substrate using a sheet-like, and preferably flexible, interposer. The interposer overlies the top, contact-bearing surface of the chip. A first surface of the interposer faces towards the chip whereas a second surface faces away from the chip. Electrical terminals are provided on the second surface of the interposer, and the interposer is also provided with apertures extending through it. Flexible leads extend through these apertures between contacts on the chip and the terminals on the second surface of the interposer: The terminals can be bonded to a substrate. Because the terminals are movable relative to the contacts on the chip, the arrangements described in the '266 patent provide excellent resistance to thermal cycling. The interposer disclosed in the '266 patent may also include a compliant layer disposed between the terminals and the chip.

Further, WIPO Publication No. 9403036 published on Feb. 3, 1994, also commonly owned by the present assignee, discusses semiconductor chip mounting devices. As set forth in the '036 application, an interposer is used which has a gap extending from a first surface to a second surface. One or more conductive leads are then secured to the first surface of the interposer extending across the gap and connected at a first end to a terminal on the interposer. A second end of the lead may then be displaced downwardly to connect to a contact on a semiconductor chip. The lead may have a frangible section that is designed to break during the bonding process, leaving one end of the lead free to be displaced downwardly to make contact with the chip. Further, a compliant, dielectric bottom layer may be coupled between the interposer and the chip to provide stand off and added compliancy.

Despite the positive results of the aforementioned commonly owned inventions, still further improvements would be desirable.

SUMMARY OF THE INVENTION

The present invention provides a method and apparatus for compliantly interconnecting surface mount microelectronic devices to supporting substrates, such as printed circuit boards, to accommodate for the typically large thermal expansion mismatch between the device and the substrate.

More specifically, one aspect of the present invention provides a method which compliantly interconnects microelectronic devices and ceramic modules to supporting substrates by providing a compliant intermediate interconnection scheme that counterbalances thermal cycling problems. In one embodiment of the present invention, a flexible film circuit element (referred hereinafter as "flex circuit") having an array of bonding holes is used. On a first side of the flex circuit, an array of conductive base pads are situated such that there is a bonding hole between two successive base pads. A plurality of conductive leads is next employed to electrically connect the base pads across the bonding hole. Thus, each conductive lead bridges each bonding hole to connect the two successive base pads to create electrically connected base pad/bonding hole/conductor rows. Flex circuit contact pads are next coupled to the exposed surface of each of the base pads. Further, a highly conductive joining layer, such as gold or gold plated on to nickel, is either coupled to the underside of or completely around the conductive lead within the bonding hole. The base pad/bonding hole/conductor rows facilitate electroplating of the leads and contact pads during the fabrication process.

Each of the conductive leads has a frangible or "weak" point within or near the perimeter of each of the bonding holes and allows the lead to be cleanly broken or fractured in response to a orthogonally directed force. The frangible point can be created by any suitable means, such as scoring the lead, creating a "thin" area in the lead either in width or depth or not coupling the highly conductive joining layer to a small portion of the underside of the lead.

The microelectronic device has an array of device contact pads each of which is placed opposite a respective bonding hole when the device's surface and a second side of the flex circuit are placed opposite one another. A plurality of compliant elastomer pads or buttons are sandwiched between the device and the second side of the flex circuit and adhere the device and the flex circuit together. Typically, the compliant pads are located under each flex circuit contact pad to provide structural support when the flex circuit contact pads are eventually connected to the contacts on a circuit board.

Each of the frangible points in the conductive leads is then cleanly broken, generally using a device known as a forming tool, and the leads are bent into electrical contact with their respective device contact pads. The leads and device contact pads are then coupled using a suitable coupling technique, such as ultrasonic, thermosonic or compression bonding. In a preferred embodiment, the "open" area between the flex circuit, the microelectronic device and the compliant pads may then be filled with uncured elastomer, which is then cured. This last step provides added support for the leads and the compliant pads.

Another aspect of the present invention provides a compliant microelectronic device mounting device which effectively counterbalances problems due to thermal expansion mismatch between the microelectronic device and a supporting substrate. In one embodiment, a flex circuit having at least one bonding hole extending through from a first to a second side is used. The first side of the flex circuit further has at least one conductive lead and at least two contact pads, such that each lead bridges a respective bonding hole to connect two successive contact pads. Each conductive lead further has a frangible point within or near a perimeter of its respective bonding hole. A compliant layer is then placed between the flex circuit and the microelectronic device. Typically, the compliant layer includes an array of compliant pads or buttons. These pads need not be positioned anywhere in particular, but are generally positioned underneath each flex circuit contact pad. A forming tool is generally used to break each lead at its frangible point so that the lead may be connected to an opposing device contact pad. A liquid may be injected in the space between the compliant pads and cured to give added support to the leads and the compliant pads.

The foregoing and other objects and advantages of the present invention will be better understood from the following Detailed Description of a Preferred Embodiment, taken together with the attached Figures.

DETAILED DESCRIPTION OF A PREFERRED EMBODIMENT

Figure 1A:
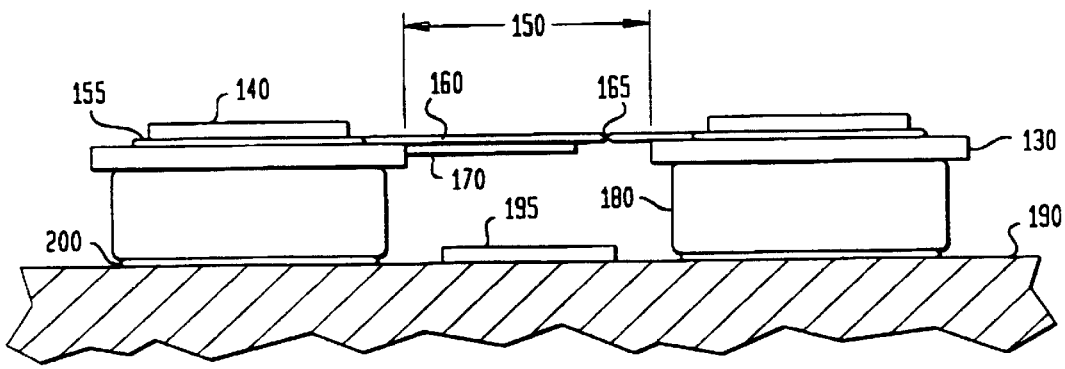
FIG. 1A is a cross sectional representation of one embodiment of the present invention before a connection has been made between contacts on the microelectronic device and flexible film circuit element.
Figure 2:
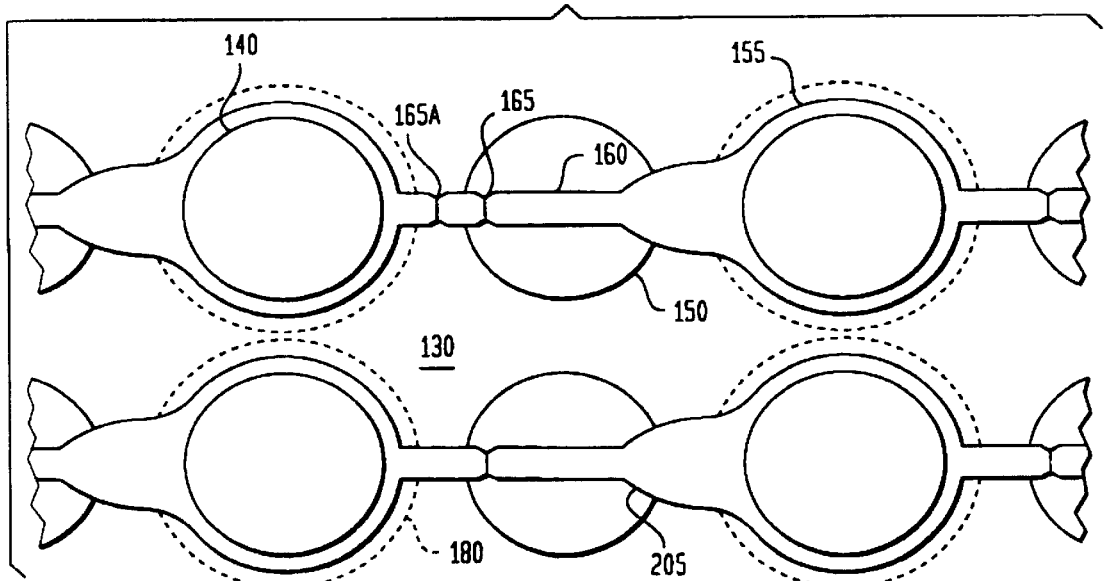
FIG. 2 shows a top view of one embodiment according to the present invention.
Figure 3:
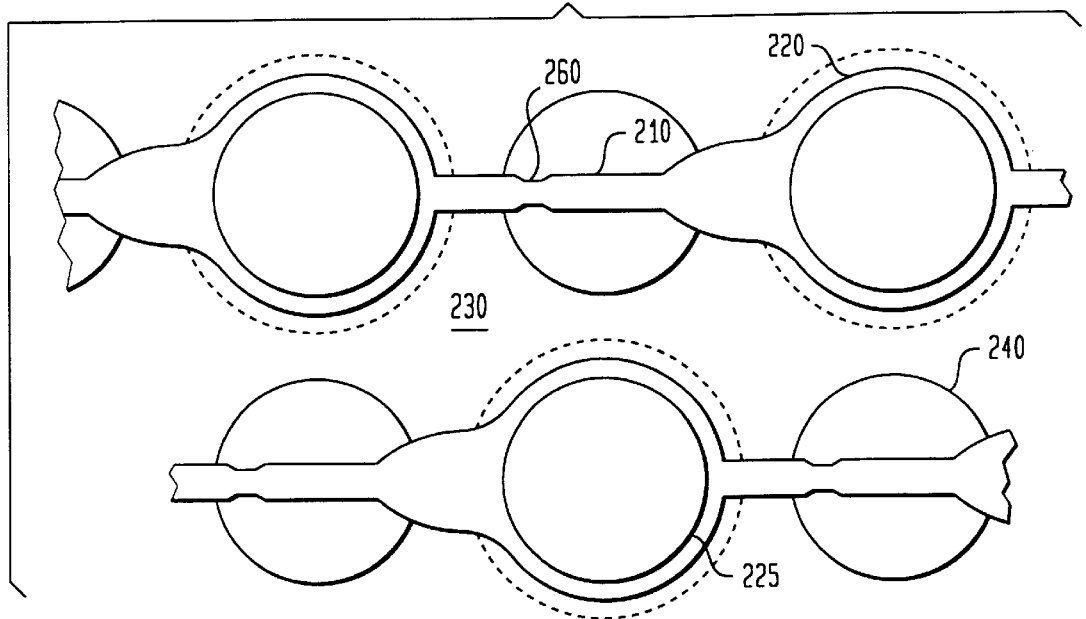
FIG. 3 shows a top view of an alternate embodiment according to the present invention.

FIG. 1A shows one embodiment of the present invention for a compliant ball grid array ("BGA"). A flexible, but substantially inextensible, film circuit element (or "flex circuit") 130 preferably formed from a polymeric material, such as Kapton™, of an approximate thickness between 25 microns and 75 microns having lithographically pre-formed rows of flexible, conductive leads 160 and base pads 155, typically made of copper approximately 18 microns thick, as discussed in detail hereinafter in reference to FIGS. 2 and 3, is used as a flexible substrate on which to plate an array of flex circuit contact pads 140, preferably comprised of nickel or palladium-nickel. The flex circuit contact pads 140 are plated directly above the base pads 155. An array of bonding holes 150 in the flex circuit 130 is situated between each of the flex circuit contact pads 140 such that each conductive lead 160 spans a respective bonding hole 150 to connect successive flex circuit contact pads 140. A highly conductive joining layer 170, such as a 2.5 micron thick layer of 99.99% gold or gold plated on to nickel, is next provided either on the underside of or completely around the conductive lead 160 within each bonding hole 150. The conductive leads 160 further have a frangible point 165 which allows a clean, brittle fracture of the lead, as discussed hereinafter. A flexible solder mask, such as a protective dielectric cover layer, may also be placed the over the entire circuit area of the flex circuit 130 and lithographically exposed and developed such that the solder mark covers the entire circuit side of the flex circuit 130 except for the contacts 140 and the bondable lead area (150/160). Preferably, the thickness of the solder mask is between 25–50 μm.

Compliant dielectric pads or buttons 180, typically made of an elastomer material, such as the Dow Corning silicone elastomer 577, known as "Silgard™", having a first and a second side are coupled to the reverse or second side of the flex circuit 130 by conventional stencil printing techniques and are typically positioned directly under each flex circuit contact pad 140. The silicone elastomer used in the preferred embodiment is filled with about 5–10% of fumed silica in order to obtain a stiff consistency that allows the stenciled pads to retain their shape after the stencil is removed. The silicone is then cured at a suitable temperature. The first side of the compliant pads 180 are then coupled to the second side of the flex circuit 130 and the second side of the pads 180 are coupled to a first surface 190 of the microelectronic device. The compliant pad is generally coupled through the use of an adhesive layer 200. The thickness of the compliant pads is largely dependent upon the length of each conductive leads 160 after they are fractured, as discussed in detail hereinafter. Each lead 160 must be long enough to be connected to the device contact pads 195. Typically, the thickness of the complaint pads is 150 microns, plus or minus 12.5 microns.

FIG. 2 shows a top view of the device discussed in FIG. 1A. As previously discussed, the conductive leads 160 and base pads 155 are pre-formed in rows on the flex circuit 130 with the array of flex circuit contact pads 140 being plated onto the base pads 155. The conductive leads 160 span the gap created by the bonding holes 150 to create rows of leads 160, contact pads 140, and bonding holes 150. Each conductive lead 160 has a frangible point either within the perimeter of the bonding holes 150, as shown at 165, or alternately near the perimeter of the bonding holes on the flex circuit 130, as shown at 165A. The frangible point (165 or 165A) is shown in FIG. 2 as a notched element which allows a clean, brittle fracture of the lead 160, however, the frangible point may also be accurately thought of as simply a "weak" point in the conductive lead 160 which allows for the fracture of the lead. This frangible point can be created by any suitable means, such as selectively plating or etching the lead, scoring the lead, creating a "thin" area in the lead either in width or depth or not coupling the highly conductive layer (170 in FIG. 1A) to a small portion of the underside of the lead 160. The conductive lead 160 further typically has a lead flare portion 205 which provides a point for the lead to bend towards the surface of the device contact pads (195 in FIG. 1A). If the bonding holes 150 are situated in columns, as in FIG. 2, the bonding holes 150 could be replaced with a bonding channel which could span beneath multiple conductive leads.

Figure 1B:
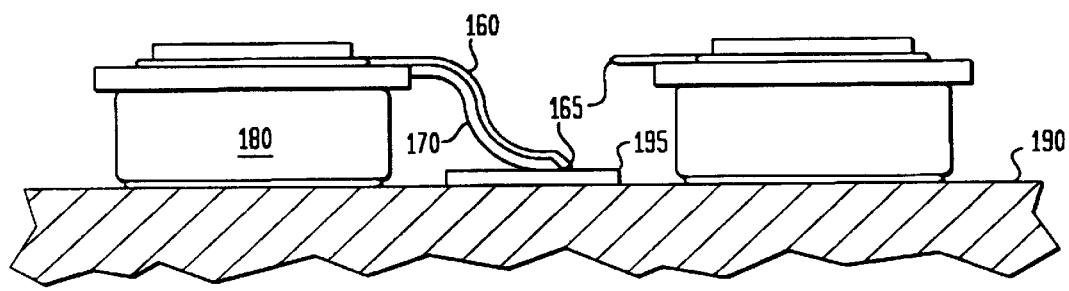
FIG. 1B is a cross sectional representation of the embodiment of FIG. 1A after a connection has been made between the microelectronic device and flexible film circuit element.

Referring to FIG. 1B, once the aforementioned device has been made and adhered to the first surface of the MCM 190, the flexible, conductive leads 160 are broken at their frangible points 165 and bent towards the device contact pads 195 until the surface of the highly conductive joining layer 170 is contacting the device contact pads 195. Each broken lead 160 is then coupled to the underlying flex circuit contact pad 195 by a suitable means, such as ultrasonic, thermosonic or compression bonding. The actions of breaking, bending and coupling the lead 160 is typically performed with a bonding tool. Typically, the bonding tool has an elongated groove in its bottom surface which positioned above each contact so that the groove extends in a pre-selected groove direction and extends across the top of a contact. The connection sections of the leads extend generally parallel to the groove direction, so that when the bonding tool is advanced downwardly to engage the lead 160, the connection section of each lead is seated in the groove. If the lead 160 is slightly out of alignment with the groove, the lead 160 will be moved in lateral directions, transverse to the groove, until it seats in the groove and thus becomes aligned with the device contact pad 195. The bonding tool is more fully disclosed in U.S. patent application Ser. No. 096,700, filed Jul. 23, 1993.

In the preferred embodiment, the space between the compliant dielectric pads 180 is then filled with compliant, dielectric material. The dielectric filling is typically uncured, solvent free elastomer, such as the Dow Corning 577 silicone elastomer mentioned previously. The uncured filling is then cured at a suitable temperature. The combination of the compliant pads 180 and the cured, compliant filling creates an compliant layer completely filling the area between the microelectronic device 190 and the flex circuit 130. Alternately, this could be accomplished by providing a compliant layer between the device 190 and the flex circuit 130 having an array of holes which line up with the bonding holes 150 in the flex circuit 130. After the leads 160 are broken and bonded, each discrete hole 150 could be filled with uncured compliant material which could then be cured. However, this alternate solution is more cumbersome and thus is not preferred. A further alternate solution for creating a compliant layer includes first providing an initial stand-off between the device 190 and the flex circuit 130 with substantially rigid posts coupled therebetween and filling the area around the posts with a compliant material after the leads 160 have been broken and bonded. However, this solution is not preferred because the rigid posts will impede compliance of the structure.

The resulting device is a compliant BGA which may be coupled at its contact pads (140 of FIG. 1A) to a supporting substrate, such as a printed circuit board, and will effectively accommodate for the differences in the thermal expansion between the printed circuit board and the microelectronic device due to the flexibility of the conductive leads and encapsulating compliant dielectric material. Further, the bottom side of the polymer film may be used as a power plane, a ground plane or a shielding layer by providing a conductive material, such as copper, on the second side of the flex circuit 130.

FIG. 3 shows an alternate embodiment where the bonding holes 240 and the contact/base pads (225/220) alternate their respective column positions creating an interstitial contact/base pads pattern on the surface of the flex circuit 230.

Figure 4:
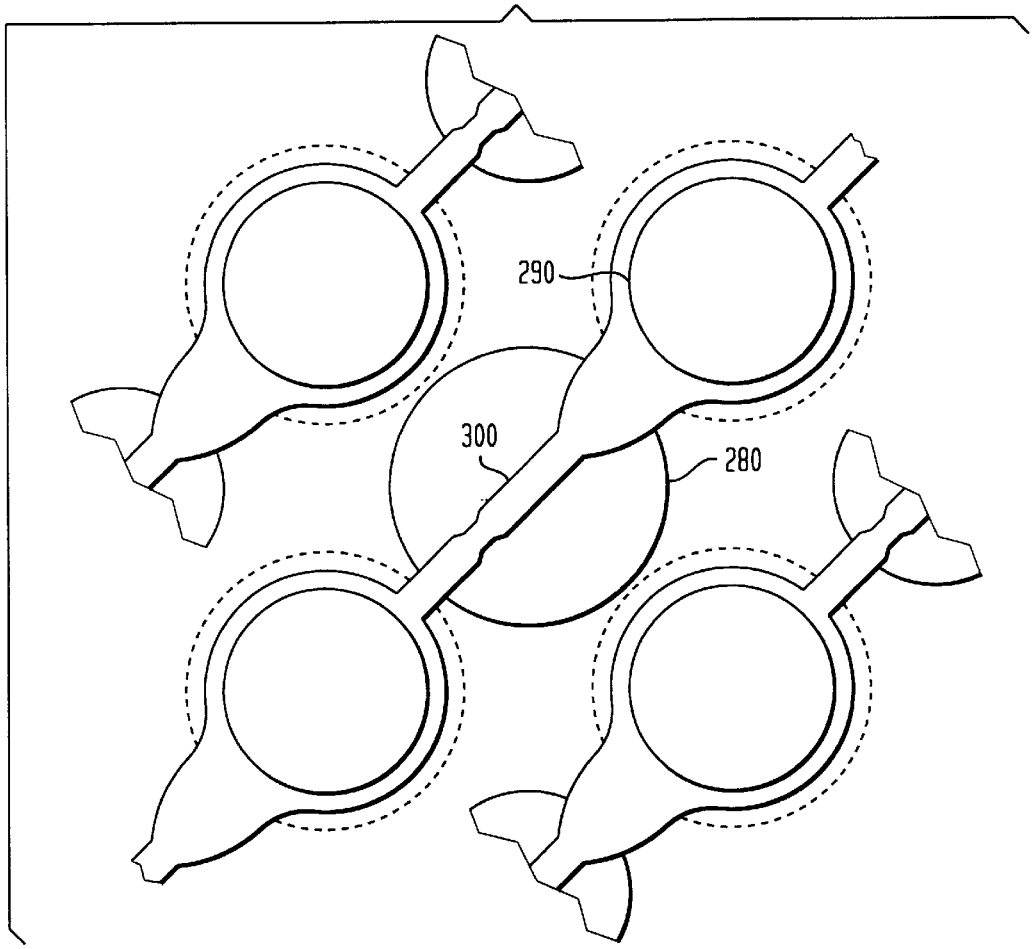
FIG. 4 shows a top view of an alternate embodiment according to the present invention.

FIG. 4 shows a further embodiment, which is preferred for simple square arrays of flex circuit contact pads 290, where the bonding holes 280 are situated in the center of four contact pads 290. In the embodiment shown in FIG. 4, the conductive leads 300 run diagonally from a first contact pad to a second contact pad bridging each bonding hole 280. The embodiment shown in FIG. 4 allows for a larger bonding hole 280 thereby also allowing for a larger bond window and a longer conductive lead which further allows for a larger thermal coefficient of expansion mismatch and thus for a more elastic connection. The design shown in FIG. 4 is further preferred because the bonding holes 280 may be symmetrically placed around the flex circuit contact pads 290.

Exemplary Table 1 shows contact pad size, bonding hole size and bonding hole to pad space for a contact pad pitch of 0.5 mm using the embodiment shown in FIG. 3. Table 2 gives the same information for the embodiment shown in FIG. 4. As can be seen by a comparison of Tables 1 and 2, the embodiment shown in FIG. 4 allows larger bonding holes and larger pads to be used.

TABLE 1

Contact pad pitch of 0.5 mm

| Pad Size | Bonding Hole Size | Bonding Hole to Pad Space |
| --- | --- | --- |
| 14 mils | 4 mils | 1 mil |
| 12 mils | 6 mils | 1 mil |
|  | 5 mils | 1.5 mils |
| 10 mils | 8 mils | 1 mil |
|  | 5 mils | 2.5 mils |
| 8 mils | 8 mils | 2 mils |
|  | 5 mils | 3.5 mils |

TABLE 2

Contact pad pitch of 0.5 mm

| Pad Size | Bonding Hole Size | Bonding Hole to Pad Space |
| --- | --- | --- |
| 14 mils | 8 mils | 3.1 mils |
|  | 5 mils | 4.6 mils |
| 12 mils | 8 mils | 4.1 mils |
|  | 5 mils | 5.6 mils |

The unbroken rows or diagonally situated conductive leads substantially aid in the plating of the flex circuit contact pads (140 in FIG. 1A), which ultimately can be thought of as the ball grid array ("BGA") contacts to be coupled to the printed circuit board. The rows or diagonal lines may all be connected at the periphery of the polymer film during fabrication and simply etched out or cut away at a later time.

Figure 5:
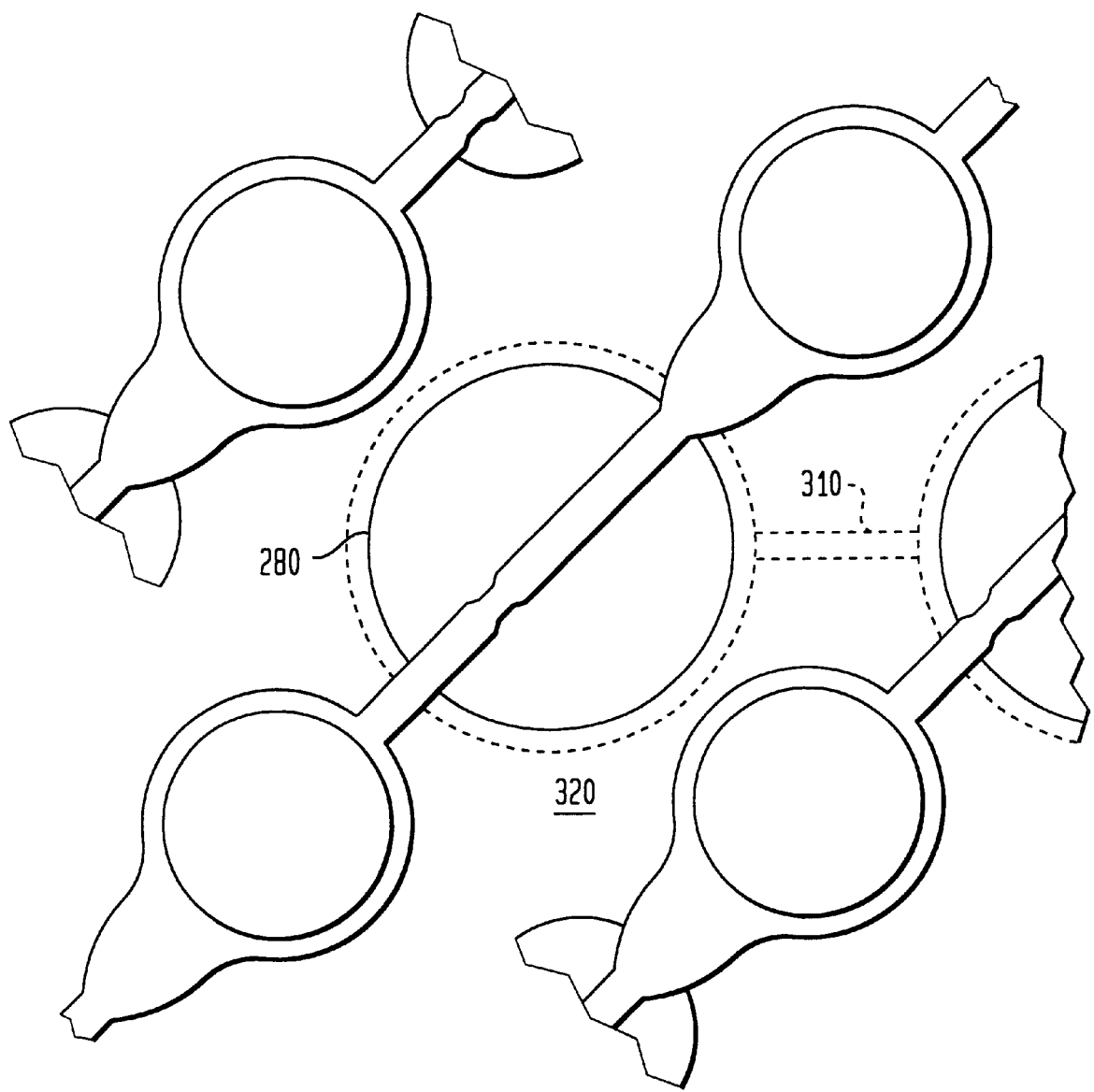
FIG. 5 shows a top view of an alternate embodiment according to the present invention.

FIG. 5 shows an alternate embodiment in which the embodiment of FIG. 4 is used but a layer of elastomer 320 is deposited, or stenciled, underneath the entire flex circuit except around the bonding holes 280. A non-elastomer passageway 310 could also be provide between successive bonding holes. This approach has the effect of minimizing any problems encountered due to air being entrapped when the liquid elastomer is subsequently injected into the open area and then hardened.

Having fully described several embodiments of the present invention, it will be apparent to those of ordinary skill in the art that numerous alternatives and equivalents exist which do not depart from the invention set forth above. It is therefore to be understood that the present invention is not to be limited by the foregoing description, but only by the appended claims.

What is claimed is:

1. A semiconductor chip assembly, comprising:
   a. a semiconductor chip having a face surface bearing a plurality of chip contacts;
   b. a substrate having conductive leads and substrate contact pads, the leads electrically connecting the chip contacts and the substrate contact pads;
   c. a plurality of compliant pads disposed between the face surface of the chip and the substrate and aligned under at least some of the substrate contact pads.

2. The semiconductor chip assembly of claim 1, wherein the compliant pads are adhered to the substrate and the face surface of the chip.

3. The semiconductor chip assembly of claim 2, wherein the substrate is flexible.

4. The semiconductor chip assembly of claim 3, wherein the substrate has a first surface facing the chip and a second surface opposite the first surface, and wherein the substrate contact pads are exposed at the second surface.

5. The semiconductor chip assembly of claim 4, wherein the substrate has a plurality of bonding holes, each of which is located adjacent to one of the substrate contact pads.

6. The semiconductor chip assembly of claim 5, wherein at least some of the substrate contact pads are disposed on the second surface of the substrate.

7. The semiconductor chip assembly of claim 6, wherein at least a portion of each lead is disposed on the second surface of the substrate.

8. The semiconductor chip assembly of claim 4, further comprising a compliant layer disposed between the first surface of the substrate and the face surface of the chip.

9. The semiconductor chip assembly of claim 8, wherein the compliant layer is disposed on at least a portion of each of the leads.

10. The semiconductor chip assembly of claim 8, wherein the substrate has a plurality of bonding holes, each of which is located adjacent to one of the substrate contact pads.

11. The semiconductor chip assembly of claim 10, wherein at least some of the substrate contact pads are disposed on the second surface of the substrate.

12. The semiconductor chip assembly of claim 11, wherein at least a portion of each lead is disposed on the second surface of the substrate.

13. The semiconductor chip assembly of claim 12, wherein each lead is a lithographically formed lead.

14. The semiconductor chip assembly of claim 13, wherein each substrate contact pad is a lithographically formed terminal and is associated with one of the lithographically formed leads.

15. The semiconductor chip assembly of claim 14, wherein each of the substrate contact pad is integral with an associated lead.

16. The semiconductor chip assembly of claim 1, wherein each lead is a lithographically formed lead.

17. The semiconductor chip assembly of claim 16, wherein each substrate contact pad is a lithographically formed terminal and is associated with one of the lithographically formed leads.

18. The semiconductor chip assembly of claim 1, wherein at least one of the substrate contact pad is integral with one of the leads.

19. The semiconductor chip assembly of claim 18, wherein each lead is associated with one of the substrate contact pads and each substrate contact pad is integral with an associated lead.

20. The semiconductor chip assembly of claim 1, wherein one of the compliant pads is aligned under each of the substrate contact pad.

* * * * *

UNITED STATES PATENT AND TRADEMARK OFFICE
CERTIFICATE OF CORRECTION

PATENT NO. : 6,370,032 B1
DATED : April 9, 2002
INVENTOR(S) : Thomas H. DiStefano, John W. Smith, Zlata Kovac and Konstantine Karavakis It is certified that error appears in the above-identified patent and that said Letters Patent is hereby corrected as shown below:

<u>Title page,</u>
Item [74], *Attorney, Agent or Firm,* "Krummholz" should read -- Krumholz --.

<u>Column 2,</u>
Line 57, "9403036" should read -- 94/03036 --.

<u>Column 8,</u>
Line 47, "pad" should read -- pads --.
Line 56, "pad" should read -- pads --.
Line 65, "pad" should read -- pads --.

Signed and Sealed this

Twenty-fourth Day of September, 2002

Attest:

Attesting Officer

JAMES E. ROGAN
*Director of the United States Patent and Trademark Office*